United States Patent
Hsu

(10) Patent No.: US 8,138,691 B2
(45) Date of Patent: Mar. 20, 2012

(54) MULTI-CHANNEL DRIVING CIRCUIT AND DRIVING METHOD THEREOF

(75) Inventor: Kuo-Ching Hsu, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 601 days.

(21) Appl. No.: 12/329,444

(22) Filed: Dec. 5, 2008

(65) Prior Publication Data

US 2010/0007287 A1    Jan. 14, 2010

(30) Foreign Application Priority Data

Jul. 10, 2008    (TW) .............................. 97126184 A

(51) Int. Cl.
*H05B 37/02*    (2006.01)

(52) U.S. Cl. ......... 315/360; 315/210; 315/299; 345/102

(58) Field of Classification Search .................. 345/102; 315/209 R, 210, 291, 299, 360
See application file for complete search history.

(56) References Cited

U.S. PATENT DOCUMENTS

| | | | | |
|---|---|---|---|---|
| 5,621,426 | A * | 4/1997 | Okada et al. | 345/95 |
| 7,282,968 | B2 * | 10/2007 | Lee | 327/112 |
| 7,321,207 | B2 * | 1/2008 | Moon | 315/323 |
| 7,633,822 | B2 * | 12/2009 | Seo | 365/208 |
| 7,868,560 | B2 * | 1/2011 | Gong et al. | 315/291 |
| 2007/0247346 | A1 * | 10/2007 | Chen et al. | 341/155 |

* cited by examiner

*Primary Examiner* — Thuy Vinh Tran
(74) *Attorney, Agent, or Firm* — Rabin & Berdo, P.C.

(57) ABSTRACT

A driving method of a multi-channel driving circuit includes: receiving multiple driving signals corresponding to multiple to-be-driven elements, providing multiple randomized time delays, respectively adjusting the driving signals according to the randomized time delays to generate multiple delayed driving signals, and respectively driving the corresponding to-be-driven elements according to the delayed driving signals.

9 Claims, 5 Drawing Sheets

MULTI-CHANNEL DRIVING CIRCUIT AND DRIVING METHOD THEREOF

This application claims the benefit of Taiwan application Serial No. 97126184, filed Jul. 10, 2008, the subject matter of which is incorporated herein by reference.

BACKGROUND OF THE INVENTION

1. Field of the Invention

The invention relates in general to a multi-channel driving circuit and a driving method thereof, and more particularly to a multi-channel driving circuit capable of effectively reducing electromagnetic interference, and a driving method thereof.

2. Description of the Related Art

When a multi-channel driving circuit is needed in the system application to drive multiple post-stage loads, an instantaneously high driving current is usually formed such that a significant electromagnetic interference (EMI) is induced to the overall system. In order to prevent the multi-channel driving circuit from generating the instantaneously high current, a regular time interleaving delaying method is used to lower the instantaneously main peak current.

FIG. 1 (Prior Art) shows clocks in a conventional multi-channel driving circuit using a regular time interleaving delay method. As shown in FIG. 1, N driving signals correspond to N channels, and a delay time amount $\Delta\tau$ exists between two adjacent driving signals so that the corresponding to-be-driven elements are driven in different driving time.

Because the driving times are interleaved and all the post-stage to-be-driven elements are not driven simultaneously, it is possible to prevent the multi-channel driving circuit from outputting the instantaneously too-high main peak current. However, each driving signal is sequentially turned into the high level voltage, but this causes multiple high-order harmonic tones in the frequency domain. FIG. 2 (Prior Art) shows frequency spectra in the conventional multi-channel driving circuit using the regular time interleaving delay method. In FIG. 2, noise exists in the frequency doubling portion so that the signal-to-noise ratio (SNR) is deteriorated.

SUMMARY OF THE INVENTION

The invention is directed to a multi-channel driving circuit and a driving method thereof, wherein a random time interleaving driving method is used in the multi-channel driving circuit in order to decrease an instantaneously main peak current outputted from the multi-channel driving circuit and thus to reduce the high-order harmonic tone generated therewith and to further suppress the electromagnetic interference.

According to a first aspect of the present invention, a multi-channel driving circuit driving method is provided. The method includes the following steps. Multiple driving signals corresponding to multiple to-be-driven elements are received. Multiple randomized time delays are provided. The driving signals are respectively adjusted according to the randomized time delays to generate multiple delayed driving signals. The corresponding to-be-driven elements are respectively driven according to the delayed driving signals.

According to a second aspect of the present invention, a multi-channel driving circuit including a time interleaving delay circuit and a randomizer is provided. The time interleaving delay circuit receives multiple driving signals corresponding to multiple to-be-driven elements and provides multiple time delays. The randomizer is coupled to the time interleaving delay circuit. The randomizer makes the driving signals be randomly and respectively adjusted according to the time delays to generate multiple delayed driving signals and thus respectively drive the corresponding to-be-driven elements.

The invention will become apparent from the following detailed description of the preferred but non-limiting embodiments. The following description is made with reference to the accompanying drawings.

DETAILED DESCRIPTION OF THE INVENTION

The invention provides a multi-channel driving circuit and a driving method thereof, wherein a random time interleaving driving method is used in the multi-channel driving circuit in order to decrease an instantaneously main peak current outputted from the multi-channel driving circuit and to further reduce the high-order harmonic tone generated therewith such that the electromagnetic interference can be suppressed and the signal-to-noise ratio can be improved.

Figure 1:
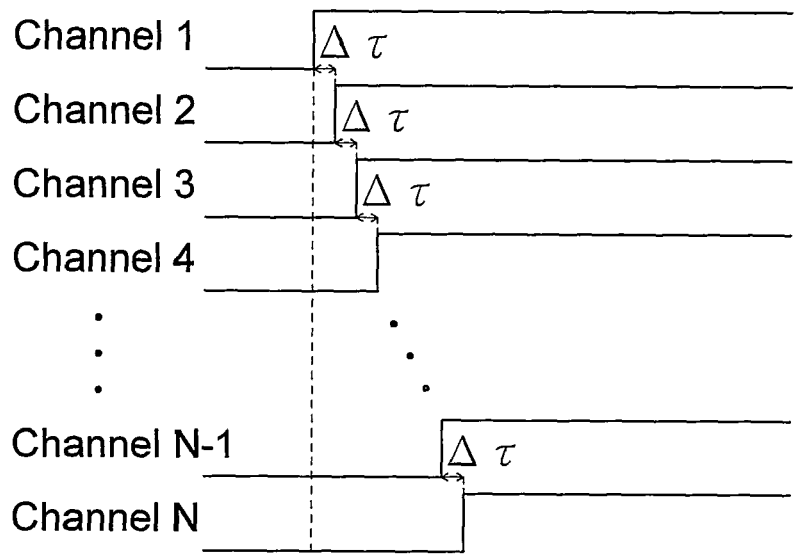
FIG. 1 shows clocks in a conventional multi-channel driving circuit using a regular time interleaving delay method.
Figure 2:
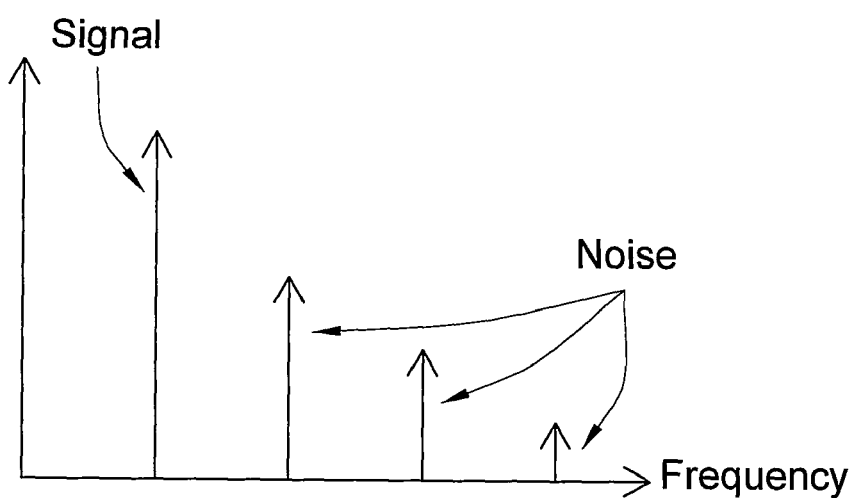
FIG. 2 shows frequency spectra in the conventional multi-channel driving circuit using the regular time interleaving delay method.
Figure 3:
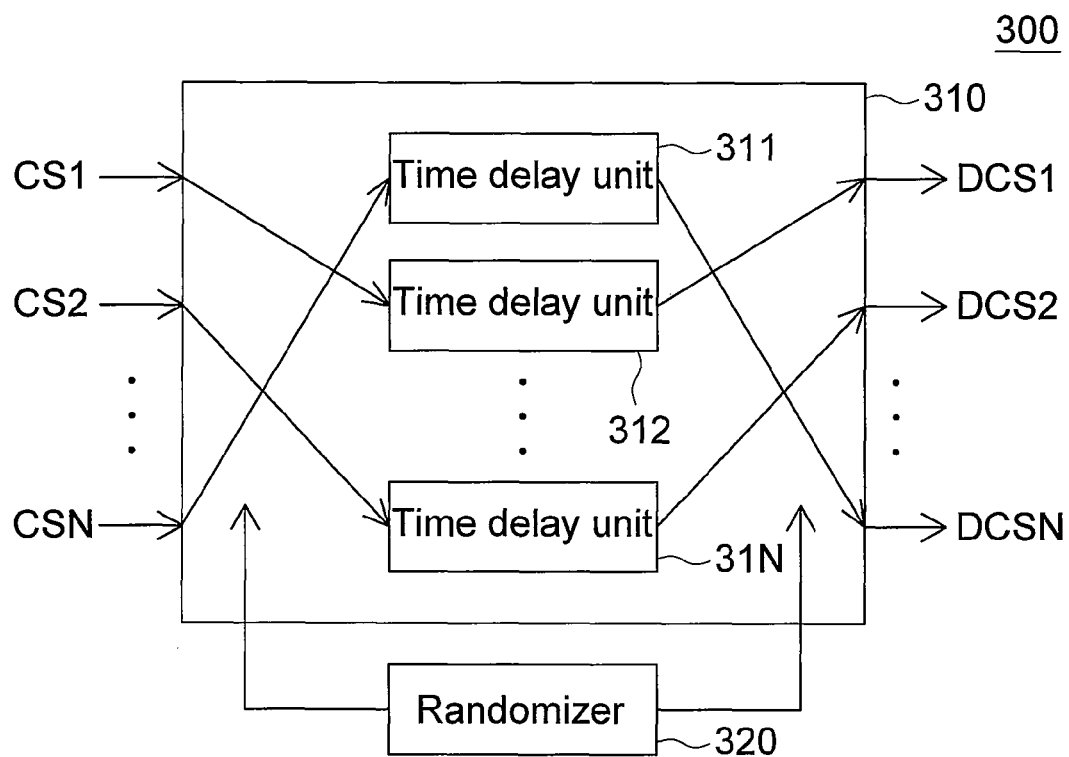
FIG. 3 is a block diagram showing a multi-channel driving circuit according a preferred embodiment of the invention.

FIG. 3 is a block diagram showing a multi-channel driving circuit 300 according a preferred embodiment of the invention. Referring to FIG. 3, the multi-channel driving circuit 300 includes a time interleaving delay circuit 310 and a randomizer 320. The time interleaving delay circuit 310 receives a plurality of driving signals CS1 to CSN corresponding to N to-be-driven elements (not shown), wherein N is a positive integer. That is, the driving signals CS1 to CSN substantially respectively pertain to N channels. The time interleaving delay circuit 310 provides multiple time delays. The randomizer 320, coupled to the time interleaving delay circuit 310, makes the driving signals CS1 to CSN be randomly and respectively adjusted according to the multiple time delays provided by the time interleaving delay circuit 310 to generate multiple delayed driving signals DCS1 to DCSN to respectively drive the corresponding N to-be-driven elements.

In the example of FIG. 3, the time interleaving delay circuit 310 provides N time delays. The time interleaving delay circuit 310 includes N time delay units 311 to 31N for providing the time delays, which are not regular and are not correlated with one another. The randomizer 320 randomly and respectively transmits the driving signals CS1 to CSN to the time delay units 311 to 31N. For example, the driving signal CS1 of the channel 1 is transmitted to the time delay unit 312, or the driving signal CS2 is transmitted to the time delay unit 31N.

Figure 4:
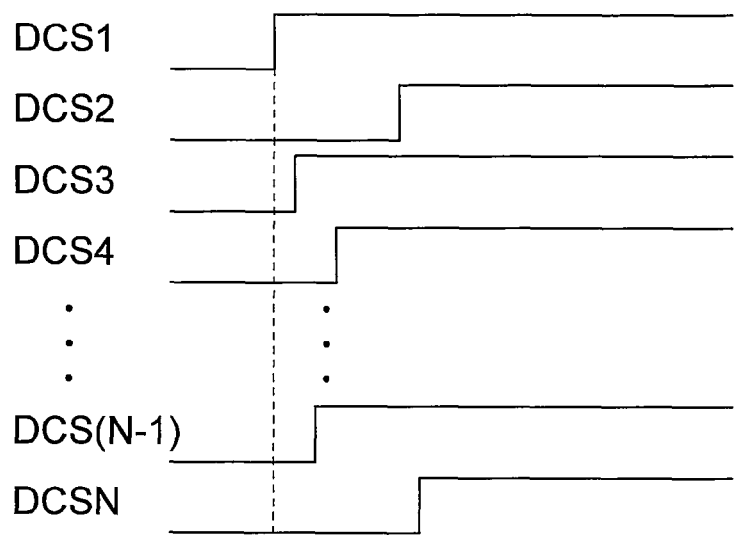
FIG. 4 shows clocks in the multi-channel driving circuit according to the preferred embodiment of the invention.

The driving signals CS1 to CSN are delayed differently and respectively according to the time delays provided by the time delay units so that differently-delayed driving signals DCS1 to DCSN are generated. Thereafter, the randomizer 320 transmits the delayed driving signals DCS1 to DCSN back to the original channels to drive the corresponding N to-be-driven elements. FIG. 4 shows clocks in the multi-channel driving circuit according to the preferred embodiment of the invention. In FIG. 4, the delayed driving signals DCS1 to DCSN are turned to the high level voltages in the orders that are not regular and are not correlated with one another.

Figure 5:
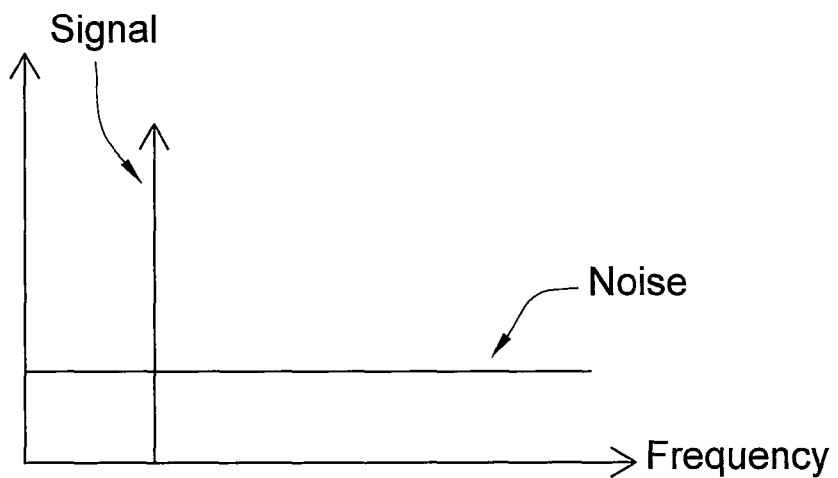
FIG. 5 shows frequency spectra in the multi-channel driving circuit according to the preferred embodiment of the invention.

Because the post-stage to-be-driven elements are alternately and not simultaneously driven and each delayed driving signal is non-sequentially converted into the voltage for driving, the aftereffect of the periodic multiple high-order harmonic tone generated in the frequency spectrum is reduced. FIG. 5 shows frequency spectra in the multi-channel driving circuit according to the preferred embodiment of the invention. As shown in FIG. 5, it is obtained that the noise is randomized and scrambled so that the noise approaches to the randomized white noise with the Gaussian distribution. That is, the multi-channel driving circuit of this embodiment can reduce the instantaneously outputted main peak current, the high-order harmonic tone generated therewith also can be reduced so that the electromagnetic interference and the signal-to-noise ratio can be improved.

Figure 6:
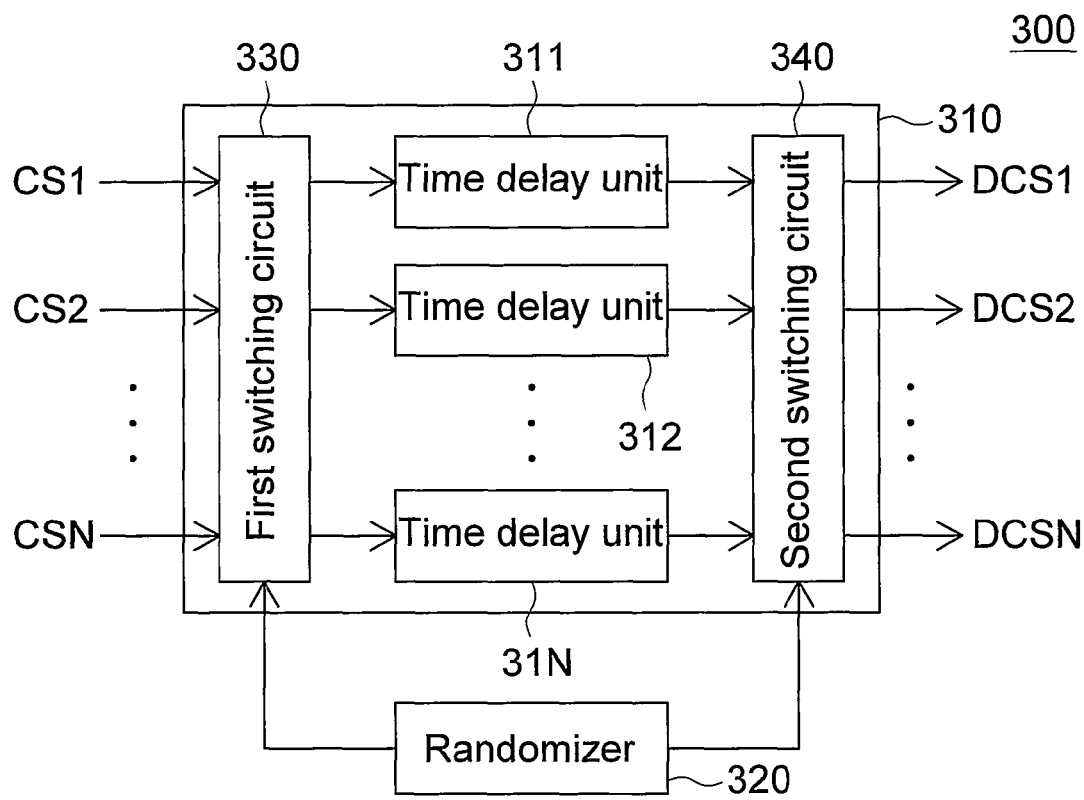
FIG. 6 is a detailed block diagram showing the multi-channel driving circuit according to the preferred embodiment of the invention.

FIG. 6 is a detailed block diagram showing the multi-channel driving circuit according to the preferred embodiment of the invention. Referring to FIG. 6, the time interleaving delay circuit 310 further includes a first switching circuit 330 and a second switching circuit 340. The randomizer 320 controls the first switching circuit 330 to randomly and respectively transmit the driving signals CS1 to CSN to the time delay units 311 to 31N, which adjust the driving signals CS1 to CSN to be the delayed driving signals DCS1 to DCSN. The randomizer 320 controls the second switching circuit 340 to transmit the delayed driving signals DCS1 to DCSN back to the original channels to drive the corresponding N to-be-driven elements.

Figure 7:
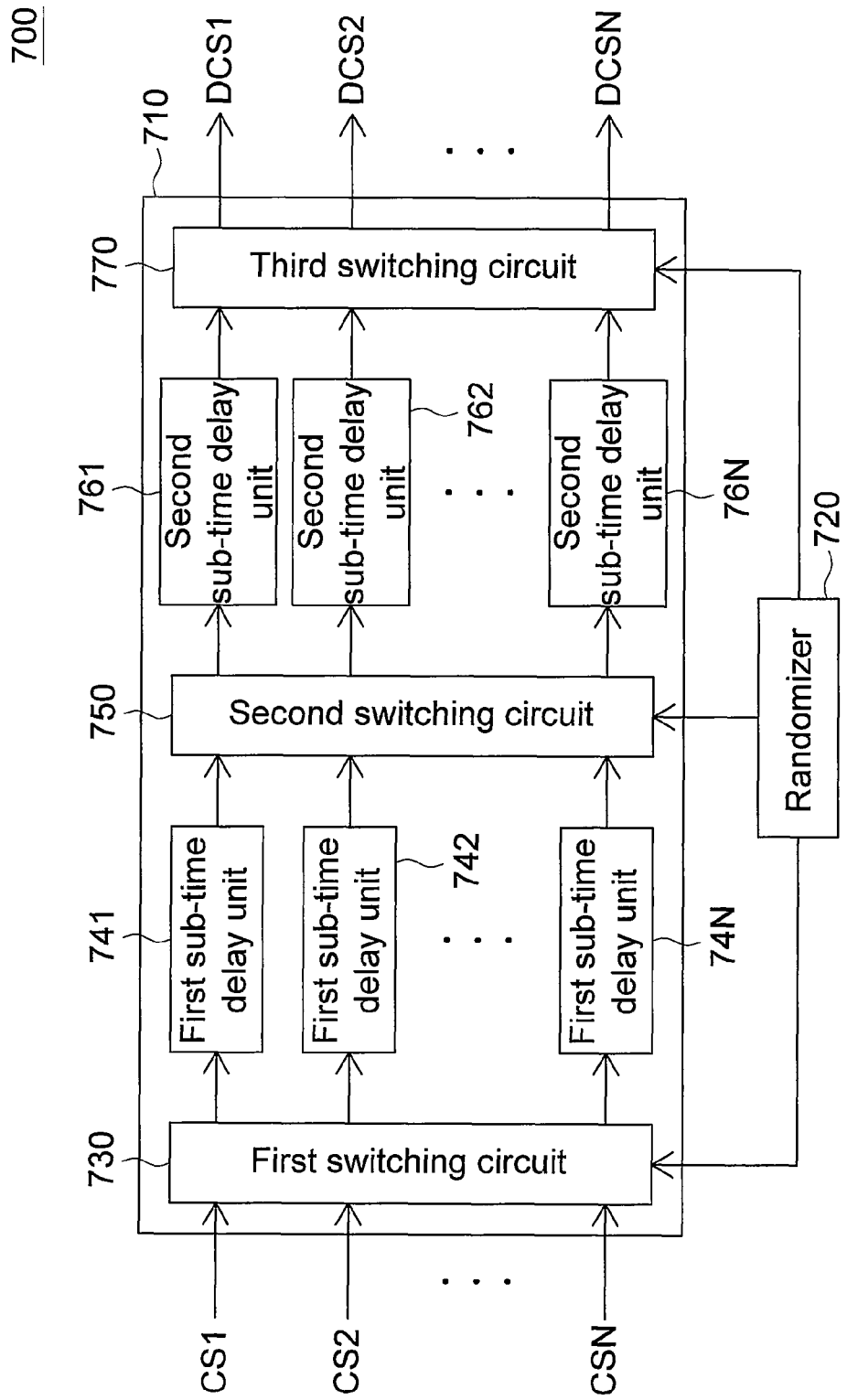
FIG. 7 is a block diagram showing a multi-channel driving circuit according to another embodiment of the invention.

In addition, the time delay units 311 to 31N may be respectively replaced with multiple sub-time delay units. FIG. 7 is a block diagram showing a multi-channel driving circuit 700 according to another embodiment of the invention. Referring to FIG. 7, the multi-channel driving circuit 700 includes a time interleaving delay circuit 710 and a randomizer 720. The time interleaving delay circuit 710 includes a first switching circuit 730, multiple first sub-time delay units 741 to 74N, a second switching circuit 750, multiple second sub-time delay units 761 to 76N and a third switching circuit 770.

The randomizer 720 controls the first switching circuit 730 to randomly and respectively transmit the driving signals CS1 to CSN to the first sub-time delay units 741 to 74N. The driving signals CS1 to CSN are adjusted according to multiple first time delays to generate multiple first delayed driving signals. The randomizer 720 controls the second switching circuit 750 to randomly and respectively transmit the first delayed driving signals to the second sub-time delay units 761 to 76N, and the first delayed driving signals are adjusted according to multiple second time delays to generate the delayed driving signals DCS1 to DCSN. The randomizer 720 controls the third switching circuit 770 to transmit the delayed driving signals DCS1 to DCSN back to the original channels such that the corresponding to-be-driven elements are driven correctly.

In addition, the power consumption can be saved according to a group driving technology. For example, N driving signals received by the time interleaving delay circuit are divided into M sets of driving signals, wherein N and M are positive integers. Consequently, the time interleaving delay circuit only has to provide M time delays, which are not regular and are not correlated with one another. The randomizer makes the M sets of driving signals be randomly and respectively adjusted according to the M time delays. That is, different sets of driving signals are adjusted according to different time delays, and the driving signals in the same set are adjusted according to the same time delay. Consequently, the high-order harmonic tone generated therewith can be reduced, and the power consumption may also be reduced.

Figure 8:
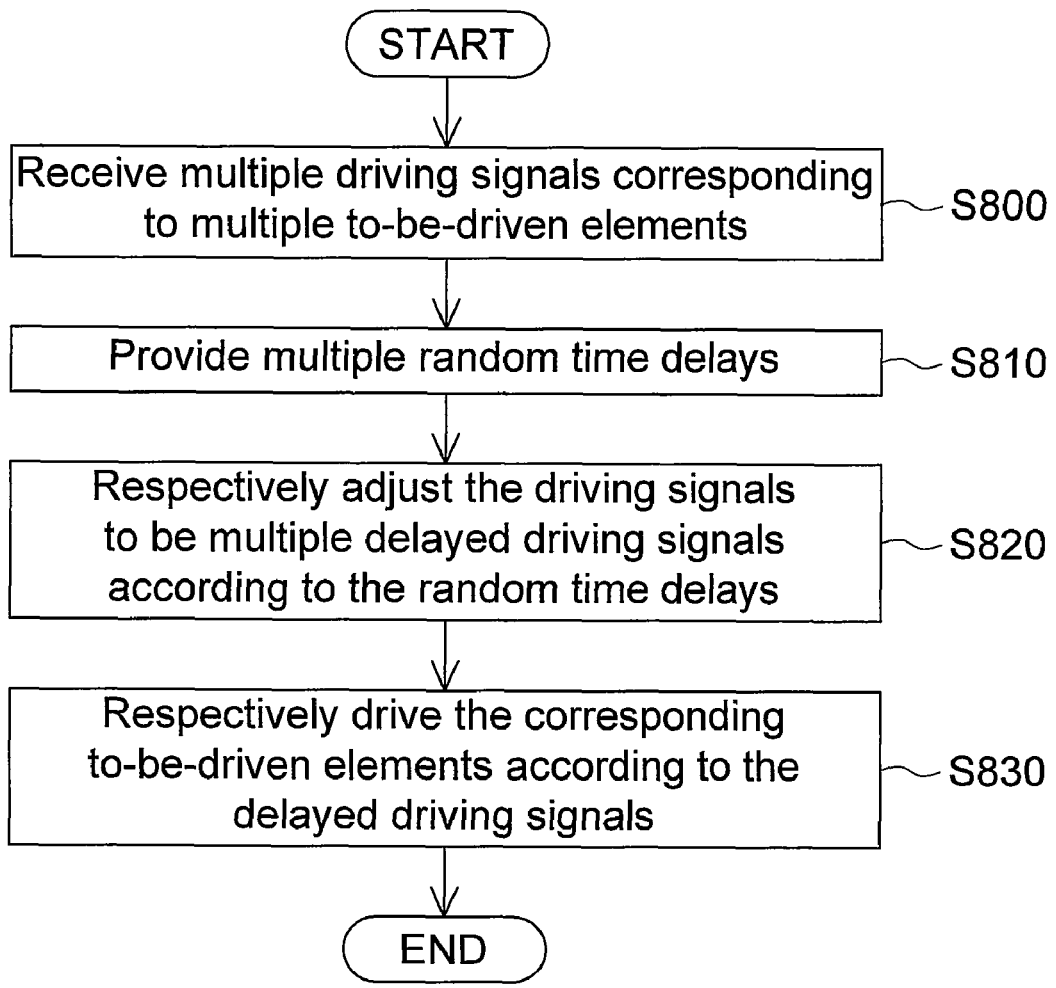
FIG. 8 is a flow chart showing a multi-channel driving circuit driving method according to the preferred embodiment of the invention.

The invention also provides a driving method of the multi-channel driving circuit. FIG. 8 is a flow chart showing a driving method of a multi-channel driving circuit according to the preferred embodiment of the invention. In step S800, multiple driving signals corresponding to multiple to-be-driven elements are received. In step S810, multiple randomized time delays are provided. In step S820, the driving signals are respectively adjusted to be multiple delayed driving signals according to the randomized time delays. In step S830, the corresponding to-be-driven elements are respectively driven according to the delayed driving signals. The operation principles of the driving method of the multi-channel driving circuit have been described in detail in the multi-channel driving circuits 300 and 700, so detailed descriptions thereof will be omitted.

In addition, the invention is preferably applied to the operation of driving the backlight module using LEDs. That is, each of the multi-channel driving circuits 300 and 700 itself may be regarded as a LED driving circuit, which can diverge the time instants of driving the portions of the backlight module according to the time interleaving method and thus reduce the noise caused during driving. However, the above-mentioned application only pertains to one embodiment, and does not intend to limit the scope of the invention.

In the multi-channel driving circuit and the driving method thereof according to the embodiments of the invention, the random time interleaving driving method is applied to the multi-channel driving circuit so that the delayed driving signals are converted into the voltages for driving. In addition, the timings are not regular and not correlated with one another. Consequently, the instantaneously main peak current outputted from the multi-channel driving circuit can be lowered, and the noise may approach to the randomized white noise with the Gaussian distribution. Thus, the high-order harmonic tone generated therewith can be reduced, the electromagnetic interference can be further suppressed and the signal-to-noise ratio can be improved.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A driving method of a multi-channel driving circuit, the driving method comprising:
   (a) receiving N driving signals corresponding to N to-be-driven elements, wherein the N driving signals are divided into M sets of driving signals, N and M are positive integers, N is larger than or equal to M, and M is larger than 2;

(b) providing M different randomized time delays;
(c) respectively adjusting the M sets of driving signals according to the M different randomized time delays to generate N delayed driving signals; and
(d) respectively driving the corresponding N to-be-driven elements according to the N delayed driving signals.

2. The driving method according to claim 1 being applied to driving a backlight module using light-emitting diodes (LEDs).

3. A multi-channel driving circuit, comprising:
a time interleaving delay circuit for receiving N driving signals corresponding to N to-be-driven elements, wherein the N driving signals are divided into M sets of driving signals, and providing M different time delays, wherein N and M are positive integers, N is larger than or equal to M, and M is larger than 2; and
a randomizer coupled to the time interleaving delay circuit, wherein the randomizer makes the M sets of driving signals be randomly and respectively adjusted according to the M different time delays to generate N delayed driving signals, and thus respectively drive the corresponding N to-be-driven elements.

4. The multi-channel driving circuit according to claim 3, wherein M=N, the time interleaving delay circuit comprises N time delay units for respectively providing the N time delays, and the randomizer randomly and respectively transmits the N driving signals to the N time delay units such that the N driving signals are respectively delayed according the N time delays to generate the N delayed driving signals.

5. The multi-channel driving circuit according to claim 4, wherein the time interleaving delay circuit further comprises a first switching circuit and a second switching circuit, the randomizer controls the first switching circuit to randomly and respectively transmit the N driving signals to the N time delay units to generate the N delayed driving signals, and the randomizer controls the second switching circuit to make the N delayed driving signals drive the corresponding N to-be-driven elements.

6. The multi-channel driving circuit according to claim 3, wherein M=N, the time interleaving delay circuit comprises a first switching circuit, N first sub-time delay units, a second switching circuit, N second sub-time delay units and a third switching circuit, the first sub-time delay units provide N first sub-time delays, the second sub-time delay units provides N second sub-time delays, the randomizer controls the first switching circuit to randomly and respectively transmit the N driving signals to the N first sub-time delay units such that the N driving signals are adjusted according to the N first sub-time delays to generate N first delayed driving signals, the randomizer controls the second switching circuit to randomly and respectively transmit the N first delayed driving signals to the second sub-time delay units such that the N first delayed driving signals are adjusted according to the N second sub-time delays to generate the N delayed driving signals, and the randomizer controls the third switching circuit to make the N delayed driving signals drive the corresponding N to-be-driven elements.

7. The multi-channel driving circuit according to claim 3, wherein M=N, the time interleaving delay circuit receives the N driving signals corresponding to the N to-be-driven elements and provides the N time delays, the randomizer makes the N driving signals be randomly and respectively adjusted according to the N time delays to generate the N delayed driving signals.

8. The multi-channel driving circuit according to claim 3 being applied to a driving circuit of a backlight module using light-emitting diodes (LEDs).

9. The multi-channel driving circuit according to claim 8, wherein the to-be-driven elements are LEDs and the delayed driving signals are respectively for driving the LEDs.

\* \* \* \* \*